United States Patent
Ma et al.

(10) Patent No.: US 7,095,640 B2
(45) Date of Patent: Aug. 22, 2006

(54) MULTIPLE MATCH DETECTION CIRCUIT AND METHOD

(75) Inventors: Stanley Jeh-Chun Ma, Gloucester (CA); Peter P. Ma, Ottawa (CA)

(73) Assignee: MOSAID Technologies Incorporated, Kanata (CA)

( * ) Notice: Subject to any disclaimer, the term of this patent is extended or adjusted under 35 U.S.C. 154(b) by 0 days.

(21) Appl. No.: 11/285,197

(22) Filed: Nov. 23, 2005

(65) Prior Publication Data

US 2006/0083042 A1 Apr. 20, 2006

Related U.S. Application Data

(63) Continuation of application No. 10/296,884, filed on May 31, 2001, now Pat. No. 6,990,001.

(51) Int. Cl.
*G11C 15/00* (2006.01)
*G11C 7/00* (2006.01)
*G06F 12/00* (2006.01)
*G01R 25/00* (2006.01)

(52) U.S. Cl. .................. 365/49; 365/189.09; 365/194; 365/207; 711/108; 711/128; 327/3; 327/51; 327/52; 327/56

(58) Field of Classification Search ............... 365/49, 365/189.09, 194, 207; 711/108, 128; 327/3, 327/56, 51, 52
See application file for complete search history.

(56) References Cited

U.S. PATENT DOCUMENTS

| 5,428,565 | A | 6/1995 | Shaw |
|---|---|---|---|
| 5,446,686 | A | 8/1995 | Bosnyak et al. |
| 5,598,115 | A | 1/1997 | Holst |
| 6,195,277 | B1 | 2/2001 | Sywyk et al. |
| 6,219,749 | B1 | 4/2001 | Schultz et al. |
| 6,253,280 | B1 | 6/2001 | Voelkel |
| 6,307,798 | B1 | 10/2001 | Ahmed et al. |
| 6,392,910 | B1 | 5/2002 | Podaima et al. |
| 6,539,466 | B1 | 3/2003 | Riedlinger |
| 6,667,924 | B1 | 12/2003 | Ahmed et al. |
| 6,705,165 | B1 | 3/2004 | Garverick et al. |
| 2005/0063241 | A1* | 3/2005 | Pereira et al. .............. 365/222 |

FOREIGN PATENT DOCUMENTS

| JP | 07 282586 | 10/1995 |
|---|---|---|
| WO | WO 96 29705 | 9/1996 |

OTHER PUBLICATIONS

Patent Abstracts of Japan, vol. 1996, No. 2, Feb. 29, 1996.

* cited by examiner

*Primary Examiner*—Amir Zarabian
*Assistant Examiner*—Ly Duy Pham
(74) *Attorney, Agent, or Firm*—Shin Hung; Borden Ladner Gervais LLP

(57) ABSTRACT

A multiple matchline sense circuit for detecting a single, more than one, or no match conditions during a search-and-compare operation of a content addressable memory is disclosed. The circuit compares the rising voltage rate of a multiple matchline to the rising voltage rate of a reference multiple matchline in order to generate a multibit result representing one of the three conditions. The circuit generates a self-timed control signal to end the search-and-compare operation, and to set the circuit to a precharge state.

20 Claims, 12 Drawing Sheets

MULTIPLE MATCH DETECTION CIRCUIT AND METHOD

CROSS REFERENCE TO RELATED APPLICATIONS

This application is a Continuation of U.S. patent application Ser. No. 10/296,884, filed on May 31, 2001 now U.S. Pat. No. 6,990,001 which claims the benefit of priority to Canada Patent Application No. 2,310,295 filed on May 31, 2000, the entire contents of which are incorporated herein by reference.

FIELD OF THE INVENTION

The present invention relates to content addressable memory. In particular, the present invention relates to a multiple match detection circuit for detecting a signal on a multiple matchline.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require a software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated, indicating whether the search word matches a stored word or not.

A CAM stores data in a matrix of cells, which are generally either SRAM based cells or DRAM based cells. Until recently, SRAM based CAM cells have been most common because of their simple implementation. However, to provide ternary state CAMs, ie. where the search and compare operation returns a "0", "1" or "don't care" result, ternary state SRAM based cells typically require many more transistors than a DRAM based cells. As a result, ternary state SRAM based CAMs have a much lower packing density than ternary DRAM cells.

To provide the desired search and compare function in a DRAM or SRAM based CAM, matchline sensing circuits are required. Each matchline sensing circuit returns the appropriate state of its matchline, and the outputs of each matchline sensing circuit can be subsequently processed to determine the number of matches.

The circuit responsible for determining the existence of a match is the multiple match detection circuit. The multiple match detection circuit receives all the matchline sense circuit outputs as input signals after the search-and-compare operation, and determines one of two states. The first possible state represents the case where the search word does not match with any stored words or matches only one stored word. The second state occurs if the search word has matched with two or more stored words. The second state is significant because only one address of a matching word is returned as the resulting address of the search-and-compare operation. In such a case, if more than one match has resulted from the search-and-compare operation, there is at least one other stored word that matched the search word.

A prior art multiple match detection circuit and scheme is disclosed in commonly owned U.S. Pat. No. 6,307,798 titled Circuit and Method for Multiple Match Detection in Content Addressable Memory, filed Apr. 24, 2000, the contents of which are incorporated herein by reference. In the multiple match detection circuit of the prior art, a multiple matchline is precharged to a high voltage level, VDD for example, and subsequently discharged when there is at least one matchline sense circuit which outputs a signal indicating a match condition. There is one discharge transistor for each matchline sensing circuit output, and all discharge transistors are connected to the multiple matchline and in parallel with each other.

The multiple match detection circuit of the prior art compares the multiple matchline voltage level to a reference voltage during a sensing period in order to differentiate between the two different states. The reference voltage is fixed to mimic a multiple matchline having only one match, hence the multiple match detection circuit will sense if the multiple matchline voltage level is either above or below the reference voltage to generate the output corresponding to the first and second states respectively. The multiple match detection circuit therefore detects the discharged multiple match line to generate an output representing one of either the first and second states.

There are several disadvantages in the multiple match detection circuit and scheme of the prior art. To reduce the silicon area occupied by the multiple match detection circuit, it is desirable to minimize the feature size of the discharge transistors. Since the current strength of a transistor changes directly with its feature size, the capacity of a small discharge transistor to pull a fully precharged matchline to ground is small. This results in very slow discharge of the multiple matchline, and increases the time required for the overall search and compare operation of the CAM. Inherent parasitic capacitance of the multiple matchline compounds this problem, which increases as CAM arrays store more words, and require more discharge transistors.

The optimal sensing margin for the multiple match detection circuit should be sufficient for the circuit to easily distinguish if the multiple matchline potential level is above or below the reference voltage. This optimal sensing margin is attained at the time when the multiple matchline voltage level has decreased to a potential level well below the reference voltage. Unfortunately, the poor voltage discharge rate of the multiple matchline previously described only allows accurate sensing to be performed at a relatively prolonged time after the multiple matchline voltage begins to fall.

The multiple match detection circuit and scheme of the prior art requires precise timing control between activation of the matchline sense circuits, activation of the reference voltage generator circuit and activation of the sense circuit within the multiple match detection circuit. Each above-mentioned circuit is activated in sequence according to specific, preset time delays, which are determined from the design parameters and simulations. Process variations during fabrication of the CAM chip and different operating conditions may cause slight shifts in the time delays, resulting in a false output from the multiple match detection circuit.

There is clearly a need for a multiple match detection circuit capable of consuming very little power and detecting multiple matchline potential levels accurately at high speed.

SUMMARY OF THE INVENTION

It is an object of the present invention to obviate or mitigate at least one disadvantage of the prior art. In particular, it is an object of the present invention to provide a multiple matchline sensing circuit, a method of using such a circuit, and a content addressable memory using such a sensing circuit, that detects no matches, a single match and two or more matches during a search-and-compare operation of a content addressable memory, quickly and accurately.

In a first aspect, the present invention provides sensing circuit for detecting a voltage. The sensing circuit includes a sense line, a current source operatively connected to the sense line, an amplifier for sensing a change in the sense line voltage, and a detection circuit for providing a multibit output. The current source switches between an off state and an on state for changing a sense line voltage from a first voltage level to a second voltage level. The amplifier senses a change in the sense line voltage to the second voltage level and provides an amplified signal corresponding thereto. The detection circuit provides a multibit output based on a difference in delay between the amplified signal changing from the first voltage level to the second voltage level and a reference signal changing from the first voltage level to the second voltage level.

According to embodiments of the present aspect, the sense line can be precharged to the first voltage level by a precharge circuit, and the sense line can be precharged to the first voltage level when the current source is in the off state. The first voltage level can be either a logic low voltage level or a logic high voltage level. The sensing circuit can further include multiple discharge transistors coupled in parallel between the sense line and ground voltage, where the gate of each of the multiple discharge transistors is coupled to an output from a respective matchline sense circuit. The current source can includes at least one p-channel transistor connected in series between a supply voltage and the sense line, or the current source can include at least one n-channel transistor connected in series between the supply voltage and the sense line. The output can be maintained by a latching circuit.

According to further embodiments, the second voltage can be either an n-channel transistor threshold voltage or a p-channel transistor threshold voltage. The reference signal can be generated from a reference sensing circuit, where the reference sensing circuit includes a dummy sense line, a dummy current source operatively connected to the dummy sense line and a dummy amplifier. The dummy current source switches between the on state and the off state for changing a dummy sense line voltage from the first voltage level to the second voltage level. The dummy amplifier detects the second voltage level and provides the reference signal.

In yet another embodiment of the present aspect, the detection circuit can include a logic gate, a first flip flop circuit and a second flip flop circuit. The logic gate receives the amplified signal and the reference signal for providing a control signal. The first flip flop circuit receives the amplified signal and the control signal for providing a first data signal. The second flip flop circuit receives the reference signal and the control signal for providing a second data signal. The first and second flip flop circuits latch the first and second data signals in response to a transition in the voltage level of the control signal. A no match condition is determined when the first data signal is at a high logic level and the second data signal is at a low logic level, and a single match condition is determined when the first data signal is at the high logic level and the second data signal is at the high logic level. A multiple match condition is determined when the first data signal is at a low logic level and the second data signal is at a high logic level.

In a second aspect, the present invention provides a method for detecting a voltage level. The method includes providing current to a sense line and a dummy sense line, detecting the transition of the sense line and dummy sense line, inhibiting current from the sense line and the dummy sense line, and providing a multibit output. The current is provided to the sense line and the dummy sense line for changing a sense line and dummy sense line voltage level from a first voltage level to a second voltage level. The transition of the sense line and dummy sense line from the first voltage level to the second voltage level is detected in the step of detecting. Current is inhibited from the sense line and the dummy sense line when either the sense line or the dummy sense line reaches the second voltage level. The multibit output is provided based on a difference in delay between the sense line changing from the first voltage level to the second voltage level and a reference signal changing from the first voltage level to the second voltage level.

In a third aspect, the present invention provides a content addressable memory. The content addressable memory includes an address decoder, data access circuitry, and a sensing circuit. The sensing circuit includes a multiple match line, a current source, an amplifier, and a detection circuit. The current source is operatively connected to the multiple match line, and switches between an off state and an on state for changing the multiple match line from a first voltage level to a second voltage level. The amplifier detects the second voltage level for providing an amplified signal corresponding thereto. The detection circuit provides an output corresponding to a delay between the sense line changing from the first voltage level to the second voltage level and a reference signal changing from the first voltage level to the second voltage level.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
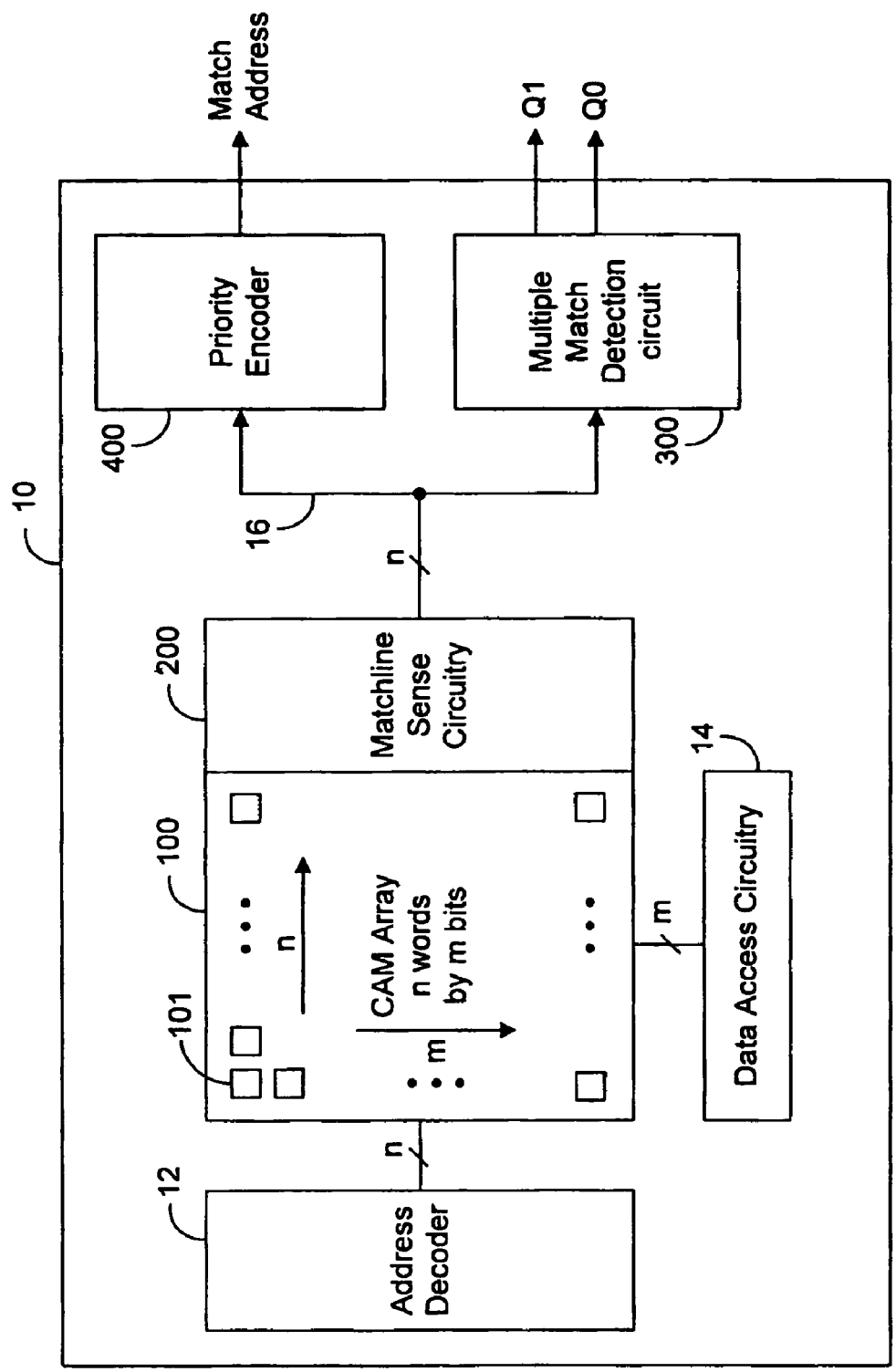
FIG. 1 shows a block diagram of a CAM

A typical CAM block diagram is shown in FIG. 1. The CAM 10 includes a matrix, or array 100, of CAM cells 101 arranged in rows and columns, where, for a ternary CAM, each cell stores one of three states: logic "1", logic "0" and "don't care", actually storing 2 bits of data. A predetermined number of CAM cells 101 in a row store a word of data. In the CAM array 100 of FIG. 1, there are n rows and m columns, where n and m are integer numbers. An address decoder 12 is used to select any row within the CAM array 100 to allow data to be written into or read out of the selected row although most commonly, data is written or loaded into the CAM and searched. The bidirectional data access circuitry 14 transfers data between the CAM array 100 and the data pins (not shown) of the CAM chip, for access by an external processor. Located adjacent to the CAM array 100 for each row is matchline sense circuitry block 200. Matchline sense circuitry block 200 comprises n matchline sense circuits and is used during search-and-compare operations for outputting an n-bit result 16 indicating a successful or unsuccessful match of a search word against the stored word. The matchline sense circuitry block results 16 for all rows are processed by the priority encoder 400 to output the address (Match Address) corresponding to the location of a matched word. Since it is possible that more than one row will match the search word, the priority encoder 400 generates the highest priority address corresponding to a matched word. Acting in parallel with the priority encoder 400 is a multiple match detection circuit 300, which assesses the matchline sense circuit results 16, and produces a two bit output Q1, Q0 representing the cases where there are no matches, only one match and two matches or more.

Figure 2:
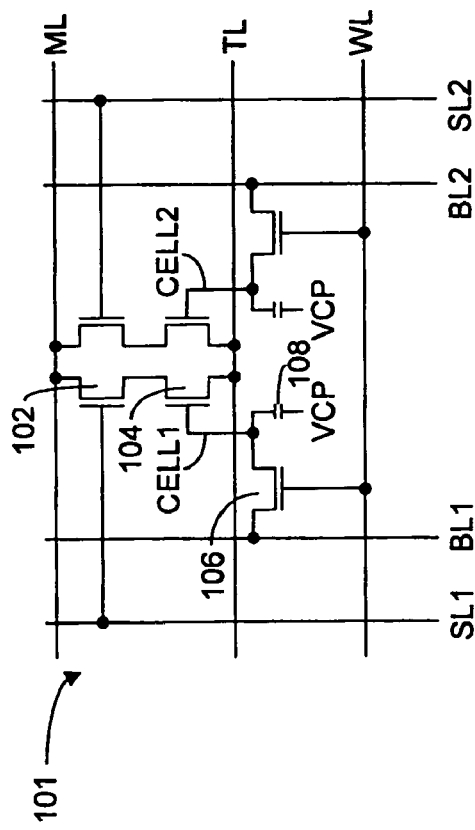
FIG. 2 shows a schematic of a DRAM based CAM cell.

A typical ternary DRAM type CAM cell 101 is shown in FIG. 2. Cell 101 has an n-channel search transistor 102 connected in series with an n-channel compare transistor 104 between a matchline ML and a tail line TL. A search line SL1 is connected to the gate of search transistor 102. N-channel access transistor 106 has a gate connected to a wordline WL and is connected in series with capacitor 108 between bitline BL1 and cell plate voltage potential VCP. Charge storage node CELL1 is connected to the gate of compare transistor 104 to turn on transistor 104 if there is charge stored on capacitor 108 i.e. if CELL1 is logic "1". The remaining transistors and capacitor, replicate transistors 102, 104, 106 and capacitor 108 for the other half of the ternary data bit, and are connected to corresponding lines SL2 and BL2 and are provided to support ternary data storage. Specifically, the three states are stored by CELL1 and CELL2 as follows: (etc. . . . ) 0/0, 0/1, 1/0, 1/1. Lines SL1, SL2, BL1 and BL2 are common to all cells of the column, and lines ML, TL and WL are common to all cells of a word in the row. The tail line TL is typically connected to ground and all the transistors are n-channel transistors. The description of the operation of the ternary DRAM cell is covered in the aforementioned reference which has been incorporated by reference. In general, for a match between search and stored data, there must be no conduction path between the matchline and the tail line, whereas for a mis-match, conduction will occur between the matchline and the tail line.

A ternary SRAM type CAM cell consists of 2 SRAM cells, to store each half of the ternary bit, and a pair of search transistors and compare transistors which duplicate the function of transistors 102 and 104 in FIG. 2. From the point of view of search operations and matchline functionality, the SRAM cell performs identically to the DRAM type CAM.

Figure 3:
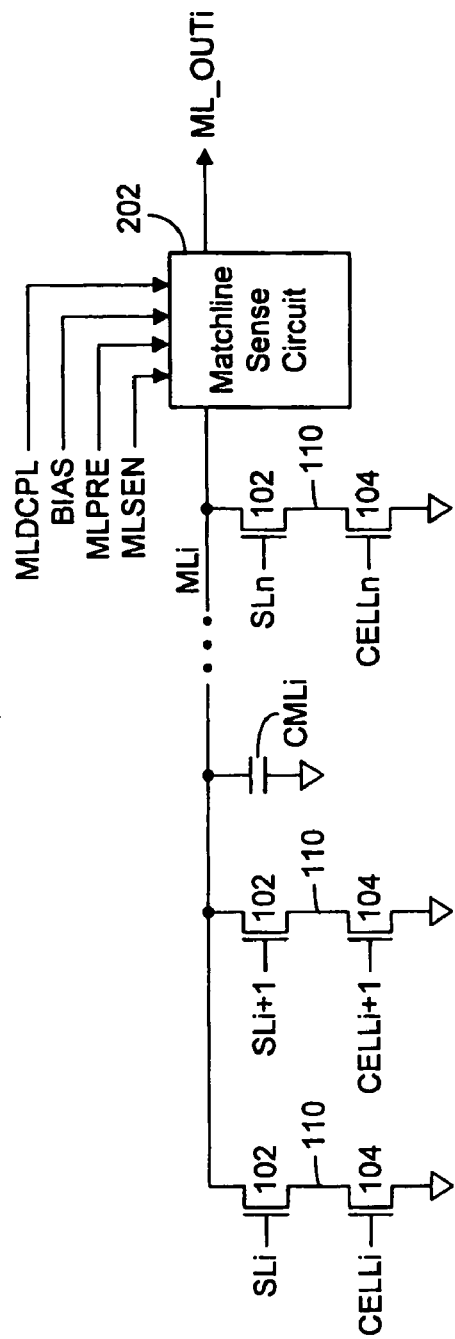
FIG. 3 shows a schematic of a matchline sensing circuitry of the prior art.

A simplified row schematic from the CAM array 100 and a corresponding prior art matchline sense circuit 202 from the matchline sense circuits 200 are shown in FIG. 3. The access transistors and storage capacitors from FIG. 2 are not shown. Multiple search and compare transistors (102 and 104 respectively), having gates connected to their respective search line SLj and cell storage node CELLi, are connected in parallel to the common matchline MLi. A matchline sense circuit 202 receives MLi and produces a matchline output ML_OUTi for the row. The matchline sense circuit 202 of the prior art requires control signals MLDCPL, BIAS, MLPRE and SEN for proper operation. For purposes of comparison with the present invention, a general description of a prior art CAM matchline sensing scheme will now follow with reference to FIGS. 1 to 4. After data is written to the cells 101 of the CAM array 100 via the bitlines, a search for a specific word of data in the cell array can be done. Every matchline MLi of the CAM array 100 is first precharged to a positive voltage level, such as VDD, through activation of a pulsed match line precharge MLPRE signal. During precharge of the matchline MLi to VDD, all search lines SLj must be grounded to turn off all search transistors 102 of every row, isolating the compare transistors 104 from the matchline MLi, to ensure that the matchlines MLi precharge to the full VDD level once the precharge phase terminates. The combination of precharging match lines to VDD and discharging all search lines to ground on every search operation consumes a lot of power. The search word is then loaded onto the search lines $SL_0$ to SLm and each cell of a word compares its stored data with the data on its respective search line. Any cell whose stored data does not match the data on its search lines SLj, called a mis-match condition, will have both transistors 102 and 104 turned on to form a current path between the matchline MLi and ground. Any cell whose stored data does match the data on its search lines SLj, called a match condition, will have no affect on the matchline MLi. Hence, if each CAM cell of a row has a match condition, then the matchline MLi for the row will remain at the precharge voltage level of VDD.

However, if at least one cell of a row has a mis-match condition, the precharge voltage of the matchline MLi will slowly discharge to ground over time. Since the matchline voltage level is neither stable nor suitable for use in subsequent logic circuits, a matchline sense circuit 202 will sense and amplify the matchline voltage level to full CMOS voltage levels, for example. The output of the matchline sense circuit 202, ML_OUTi, at a high logic level will indicate that the data of the respective row matches the search word. ML_OUTi at a low logic level will indicate that the data of the respective row has not matched in at least one bit.

Figure 4:
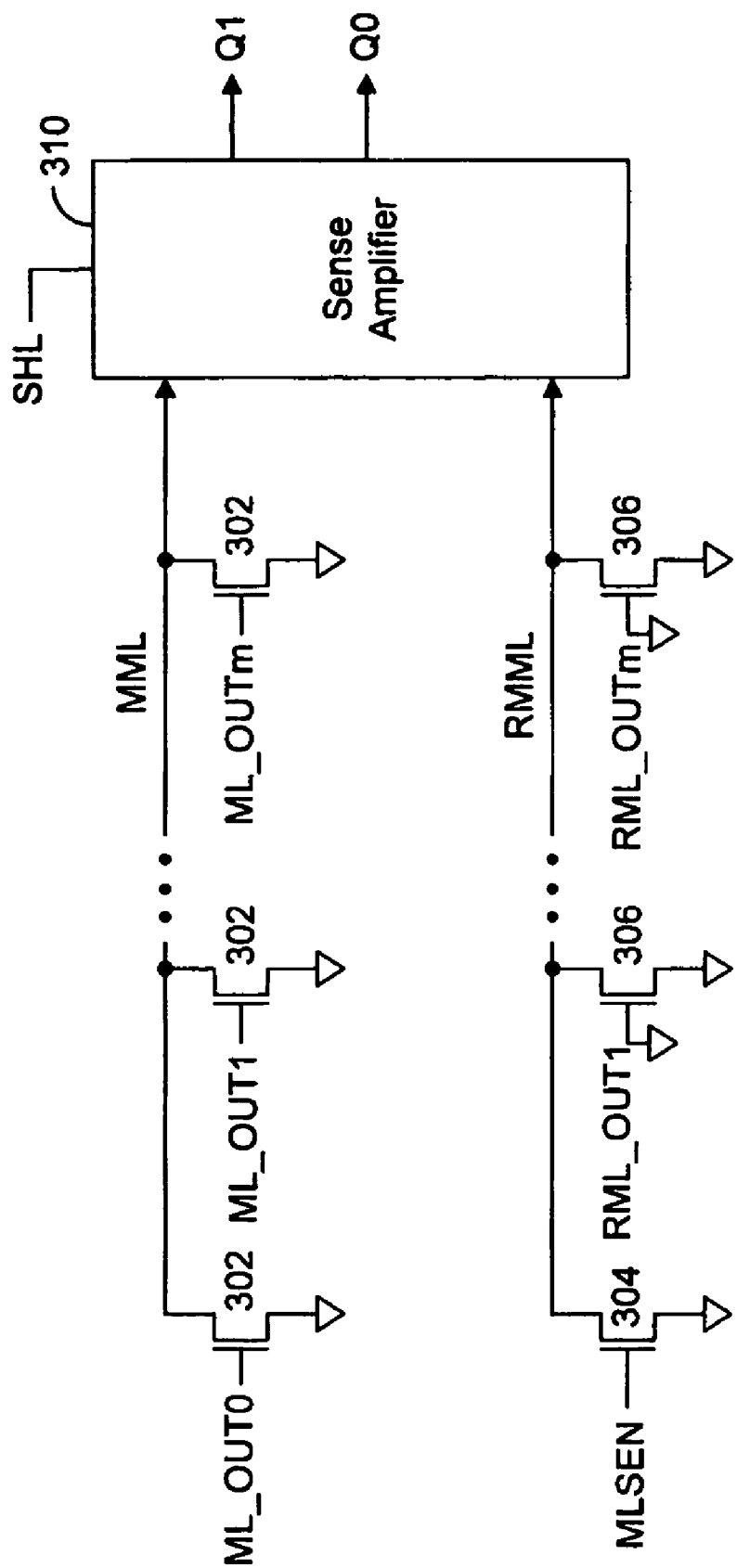
FIG. 4 shows a schematic of a multiple matchline detection circuit of the prior art.

FIG. 4 shows a multiple match detection circuit of the prior art. The circuit includes a multiple matchline MML, with many parallel connected discharge transistors 302 coupling MML to ground. The gate of each discharge transistor is connected to an output, ML_OUTi, of a matchline sense circuit 202. There is one discharge transistor 302 for each matchline sense circuit 202 output. The multiple matchline MML is connected to one input of a sense amplifier 310. A reference multiple matchline RMML is connected to another input of sense amplifier 310, having many parallel connected discharge transistors 306 coupling RMML to ground. Discharge transistors 306 are dummy discharge transistors, configured and sized identically to the discharge transistors 302, except that their gates are permanently grounded to keep them turned off. Only dummy discharge transistor 304 can be turned on by control signal MLSEN. The W/L ratio of dummy discharge transistor 304 is designed to be 1–1.5 times the size of the other normal and dummy discharge transistors 302 and 306 in order to distinguish between multiple match, single match or no match conditions. RMML has an equal number of dummy discharge transistors 304 and 306 as MML to ensure that voltage or temperature variations will affect MML and RMML equally, and that parasitic capacitance of both lines are matched. During operation, MLSEN turns on discharge transistor 304, and the voltage level of RMML will mimic the voltage level of MML when there is one match; ie, when one of ML_OUT0_ML_OUTm is at the high logic level.

Figure 5:
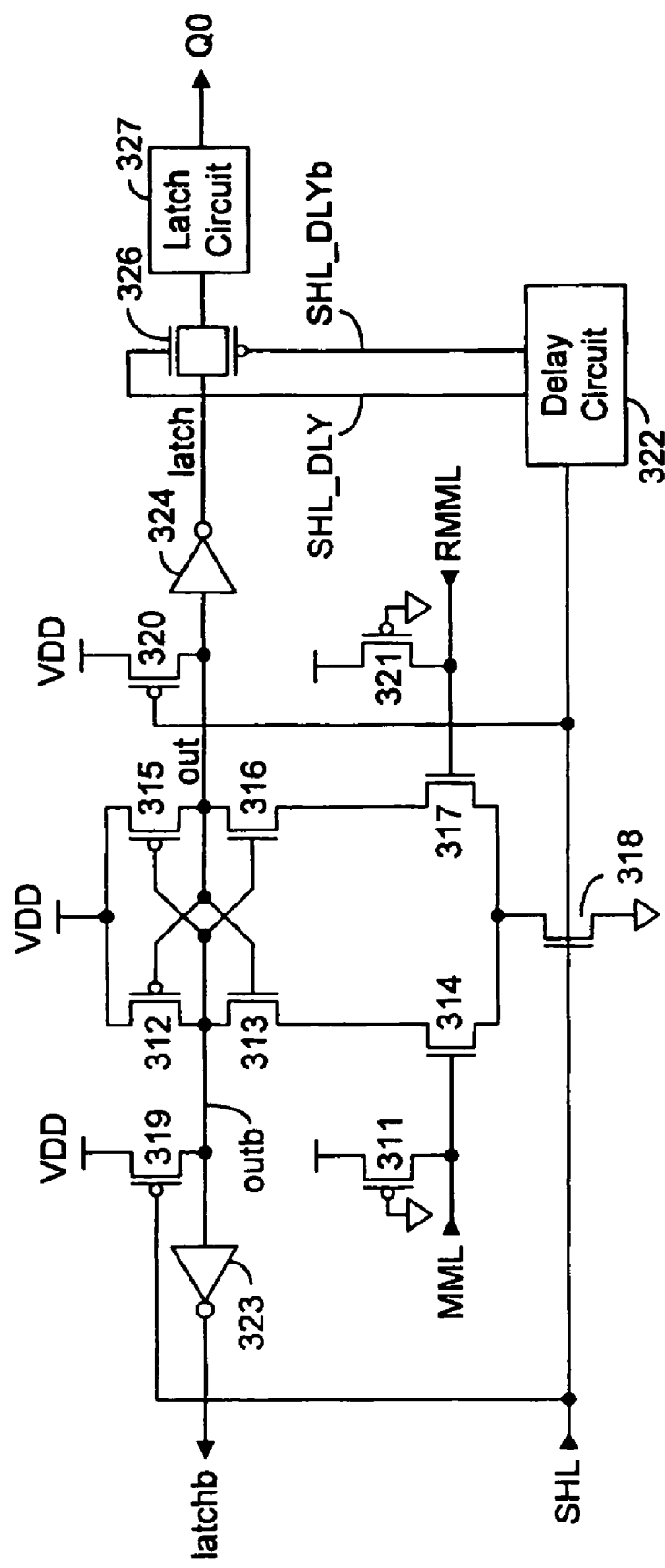
FIG. 5 shows a schematic of the multiple match sense circuit of FIG. 4.

FIG. 5 shows a detailed circuit schematic of the sense amplifier 310 of the prior art. N-channel transistors 313, 314, 316, 317 and 318, and p-channel transistors 312 and 315, form a differential amplifier which compares the voltage level of MML received on the gate of transistor 314 against the voltage level of reference multiple match line RMML received on the gate of transistor 317. Weak p-channel transistors 311 and 321 have their gates connected to ground, and clamp MML and RMML respectively, to VDD. Transistors 312 and 313 form a complementary pair connected between the high voltage supply, VDD, and the drain of transistor 314. Transistors 315 and 316 also form a complementary pair connected between the high voltage supply, VDD, and the drain of transistor 317. Both complementary pairs are connected with each other to form a cross-coupled latch. The common source of transistors 314 and 317 are connected to the drain of transistor 318. The source of transistor 318 is connected to ground and its gate is connected to control signal SHL for enabling the differential amplifier. Complementary outputs out and outb from the cross-coupled latch are inverted by inverters 323 and 324 respectively to generate latch and latchb. P-channel reset transistors 319 and 320 are connected between VDD and outb and out respectively, with their gates connected to control signal SHL. Transmission gate 326 couples signal latch to the input of latch circuit 327. Delay circuit 322 receives SHL and generates delayed complementary signals SHL_DLY and SHL_DLYb to control transmission gate 326. Latch circuit 327 generates Q0, the output representing the state of MML.

A description of the operation of the multiple match detection circuit of the prior art now follows with reference to FIGS. 3, 4 and 5. In the precharge state, all matchline sense circuits 202 (FIG. 3) are disabled, forcing ML_OUT0-ML_OUTm signals to the low logic level. Therefore, all discharge transistors 302 from FIG. 4 are turned off. Dummy discharge transistor 304 is also turned off since MLSEN is currently at the low logic level. With all discharge transistors turned off, MML and RMML (FIGS. 4 and 5 ) are held at the high logic level by clamp transistors 311 and 321 respectively. Control signal SHL is at the low logic level, to disable the differential amplifier, and to reset outb and out to the high logic level via transistors 319 and 320. SHL_DLY and SHL_DLYb remain at the low and high logic levels respectively to keep transmission gate 326 turned off.

After search data is applied to search lines SLi–SLn, control signal MLSEN will be driven to the high logic level to simultaneously turn on all matchline sense circuits 202 and dummy discharge transistor 304 after a first predetermined amount of time. When a matchline sense circuit 202 is turned on, the respective matchline MLi voltage level is sensed for immediate generation of either a logic high or logic low ML_OUTi. Therefore, in having MLSEN turn on both the matchline sense circuits 202 and the dummy discharge transistor 304 at the same time, both MML (if at least one matchline sense circuit reports a match) and RMML voltage levels will begin to discharge simultaneously.

At a subsequent second predetermined time after MLSEN is driven high, control signal SHL will be pulsed high to enable the differential amplifier and to disable reset transistors 319 and 320 for the duration of the high pulse. Once enabled, the differential amplifier will compare the voltage level of MML to the voltage level of RMML. Table 1 below lists the different logic levels of various nodes from the multiple match detection circuit of FIG. 5 when the voltage level of MML is above and below the voltage level of RMML.

TABLE 1

| RMML | MML | out | outb | Latch |
|------|------|------|------|-------|
| VREF | >VREF | HIGH | LOW | LOW |
| VREF | <VREF | LOW | HIGH | HIGH |

At a third predetermined time after SHL is pulsed high, signals SHL_DLY and SHL_DLYb pulse high and low respectively to turn on transmission gate 326 for the duration of the pulse lengths. During the time transmission gate 326 is turned on, the signal latch is retained in latch circuit 327 for further output.

Figure 6:
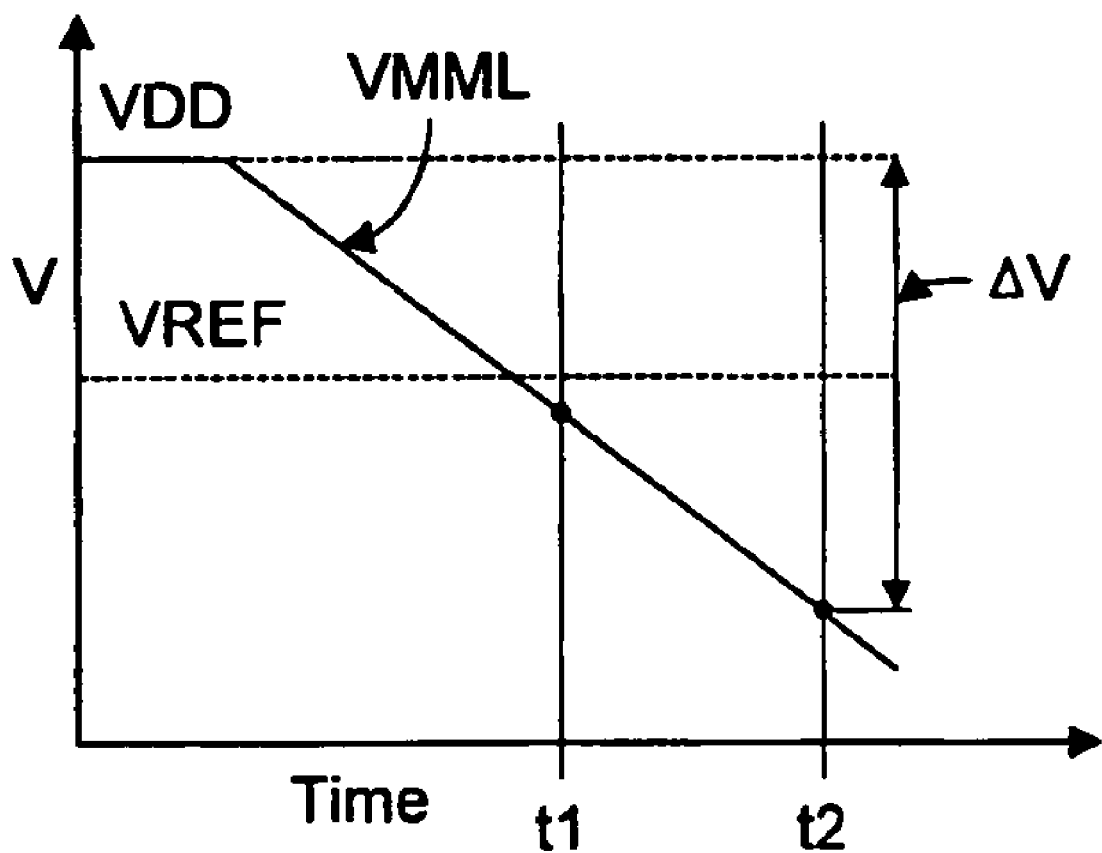
FIG. 6 shows a plot of sense margin voltage versus time for the schematic of FIGS. 4 and 5.

The prior art circuit of FIG. 5 is subject to the previously mentioned disadvantages. The time required by the multiple match detection circuit 300 (FIG. 1) to sense the MML potential is lengthy. FIG. 6 is a plot of the multiple matchline voltage VMML as a function of time in the case where two or more discharge transistors 302 are turned on (in the multiple match condition). The multiple match detection circuit 300 (FIG. 1) compares VMML to a reference voltage VREF at a predetermined time, to sense if VMML is above or below VREF. Multiple match detection circuit 300 (FIG. 1) will generate a low logic level latch if VMML is above VREF, and a high logic level latch if VMML is below VREF.

Sensing can be performed at time t1, but the sense margin is very small and a precise VREF voltage generator is required. A better sense margin can be achieved at later time t2 without the need for a high precision VREF voltage. The sensing margin for detecting between a multiple and single match case is only 0.5V which is subject to fluctuations due to process and temperature variations. However, the time between the start of VMML falling to t2 is wasteful because the CAM remains idle while waiting for the result of the comparison. Contributing to the prolonged sense time is the small feature size of discharge transistors 302 and 304 and 306. One conducting discharge transistor has a small current capacity, hence the discharge of MML (which begins in a high precharged state) to ground is very slow. Shrinking feature sizes will extend the optimal sense time past t2 because the discharge rate of VMML will be further diminished. To improve the sensing margin in the multiple matchline of the prior art, the width of dummy discharge transistor 304 is set from 1–1.5 times the size of discharge transistors 302 and 306. However, this size must be carefully selected, and the sensing margin remains relatively small.

After sensing occurs at time t2, the discharged multiple matchline MML must be precharged back to the VDD voltage supply by an amount of $\Delta V$. Hence, power consumption will be high due to the repeated discharge and precharge of multiple matchline MML in addition to the power consumed by performing the same precharge high action on individual match lines themselves.

Sequential activation of the matchline sense circuits 200, the dummy discharge transistor 304 and the multiple match detection circuit is synchronised by the first, second and third predetermined times which are created from delay circuits. Since the start of the second predetermined time is dependent on the end of the first predetermined time, and the start of the third predetermined time is dependent on the end of the second, deviation in the duration of any predetermined time may result in the output of wrong data. As well, if the transient characteristics of the circuits change due to process variations, synchronisation can be lost.

Reference will now be made to embodiments of the invention. Generally, the multiple matchline detection circuit of the present invention is a low power sense circuit for fast detection of no matches, a single match or multiple matches in the CAM cell array 100. This is achieved by setting a multiple matchline and a reference multiple matchline to a no-hit or miss default voltage level and pulling the multiple matchline to a hit voltage level before, at the same time, or after the reference multiple matchline is pulled to the hit voltage level. The multiple match detection circuit of the present invention employs a detecting circuit for detecting the first of the two multiple matchlines to reach the hit voltage level, and generates a two-bit output representing one of the states where 0, 1 or 2 and more stored words match the search word. The multiple matchline detection circuit is self-timed to disable sensing of the multiple matchline and reference multiple matchline.

Figure 7:
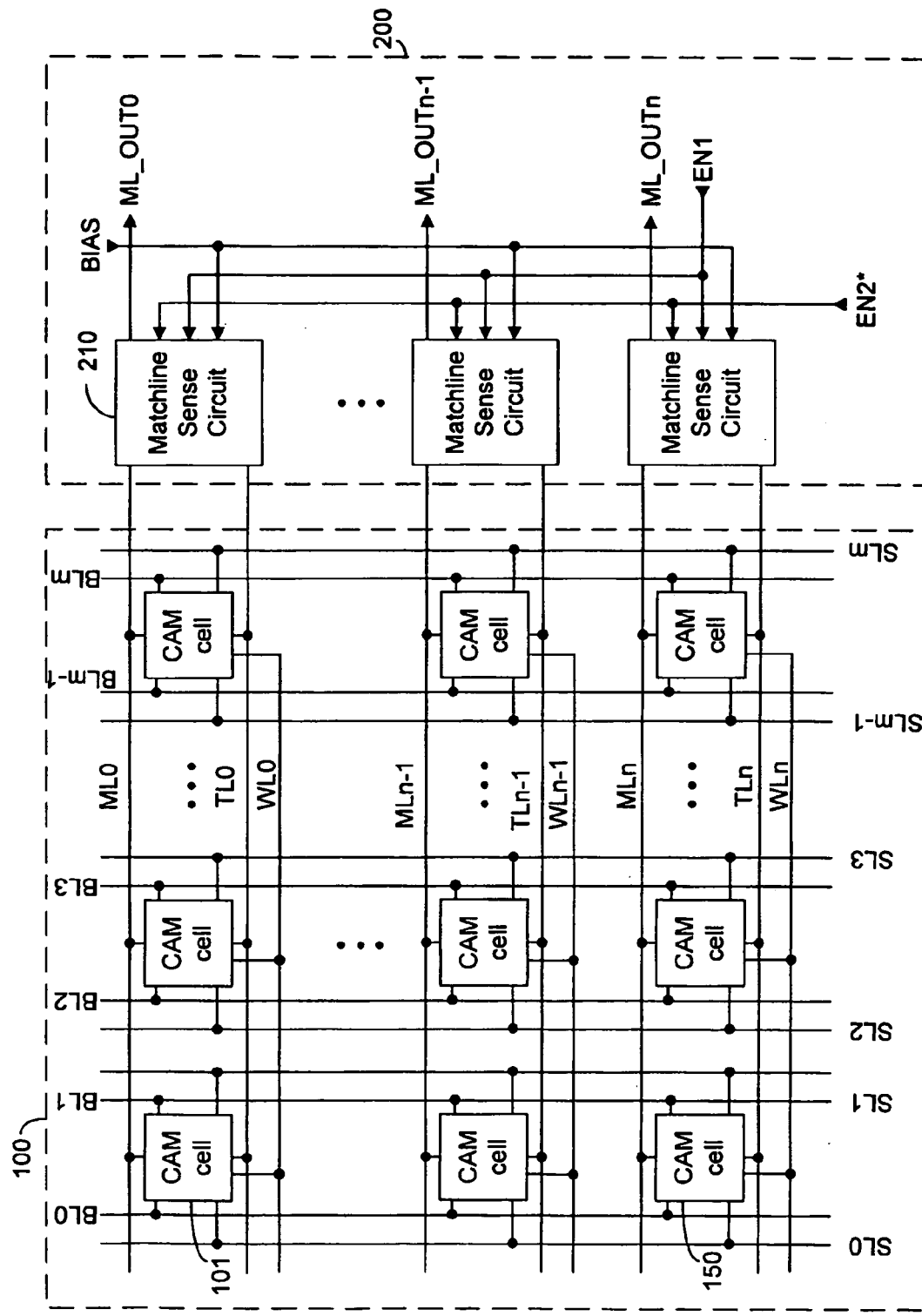
FIG. 7 shows a block diagram of the CAM array and matchline sense circuit block of FIG. 1.

FIG. 7 depicts a hierarchical view of the CAM array 100. CAM cells 101 of the CAM array 100 are arranged in rows and columns. CAM cells 101 of a row are connected to a common matchline MLi, word line WLi and tail line TLi, and CAM cells 101 of a column are connected to a common pair of search lines SLj and a common pair of bitlines BLj, where i is an integer value between 0 and n, and j is an integer value between 0 and m. Matchlines MLi and tail lines TLi are connected to their respective matchline sense circuits 210. The matchline sense circuits 210 also receive control signals EN1, EN2b and BIAS, and produce match signals ML_OUT0-ML_OUTn.

Figure 8:
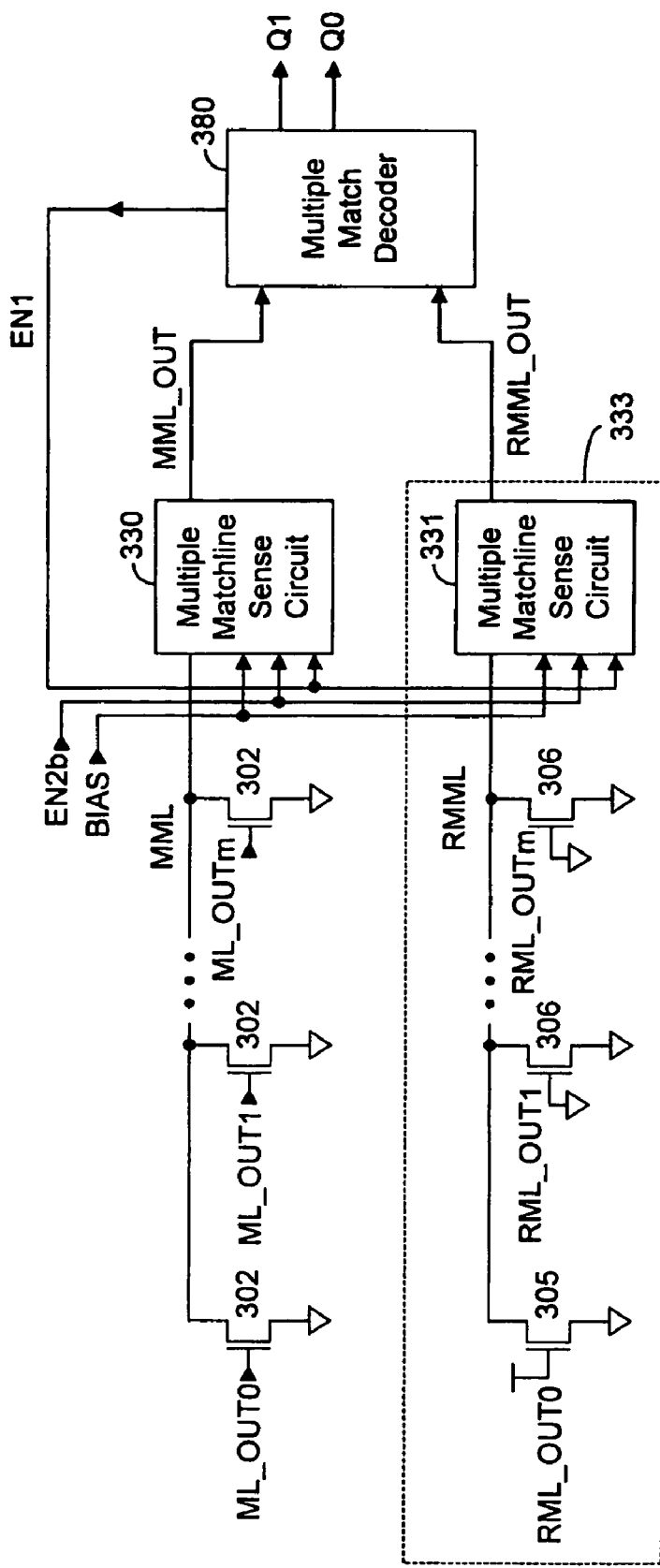
FIG. 8 shows a schematic of a multiple matchline detection circuit in accordance with a first embodiment of the present invention.

A more detailed schematic of the multiple matchline detection circuit is shown in FIG. 8 according to a first embodiment of the present invention. The configuration and connections of the discharge transistors 302 in relation to the multiple matchline MML is the same as described previously for the prior art multiple match detection circuit of FIG. 4. The configuration of the reference multiple matchline circuitry 333, and connections of the discharge transistors 306 in relation to the reference multiple matchline RMML is also the same as described previously for the prior art multiple match detection circuit of FIG. 4, with exception of transistor 305 which has its gate connected to the high voltage supply VDD. Since transistor 305 is no longer dependant on a timing signal, the reference circuit is self-timed. Also differing from the prior art is that transistor 305 is the same size as transistors 302 and 306, hence all discharge transistors 305 and 306 connected to RMML are constructed identically as discharge transistors 302 connected to MML to keep the parasitic capacitance of both multiple matchlines the same. MML and RMML are connected to their respective multiple matchline sense circuits 330 and 331, which receive as inputs, control signals EN1, EN2b and BIAS. The multiple matchline sense circuit 330 connected to MML will sense the voltage level of MML to generate signal MML_OUT, while the reference multiple matchline sense circuit 331 connected to RMML will sense the voltage level of RMML to generate signal RMML_OUT. A detecting circuit, implemented as a multiple match decoder 380, receives MML_OUT and RMML_OUT to generate a two bit, or multibit output Q1, Q0 and feedback control signal EN1.

Figure 9:
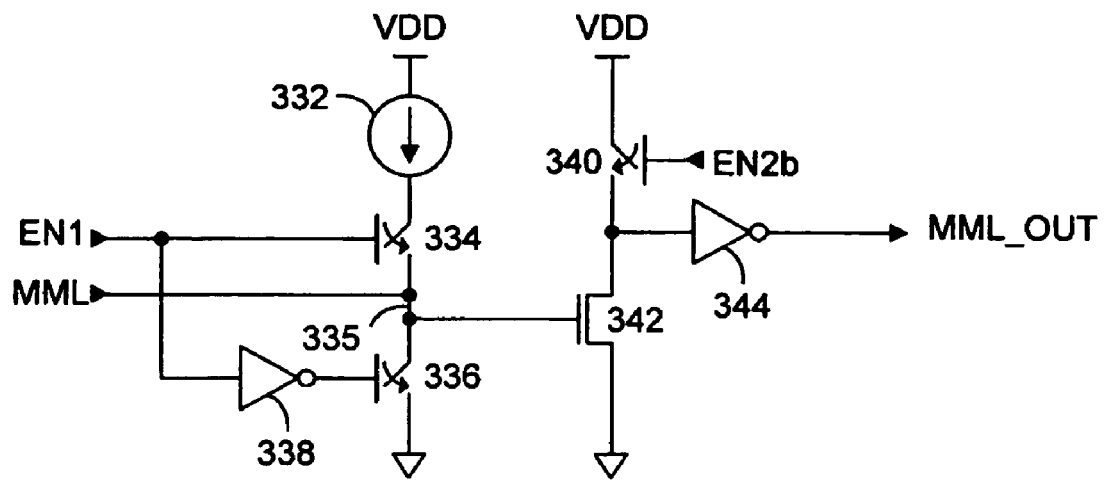
FIG. 9 shows a generic schematic of a multiple matchline sense circuit in accordance with a second embodiment of the present invention.

FIGS. 9–12 show different circuit embodiments of the multiple matchline sense circuit 330 and reference multiple matchline sense circuit 331. FIG. 9 shows a generic schematic of a multiple matchline sense circuit 330 in accordance with the present invention. The multiple matchline sense circuit has a current source 332 connected to a high voltage supply, such as VDD for example, and is connected in series with switch 334. Switch 336 is connected in series between switch 334 and a low voltage level, such as ground. Signal EN1 controls switch 334, and is inverted by inverter 338 to control switch 336. The multiple matchline MML is connected to common node 335 of switches 334 and 336, and is further connected to the gate of n-channel sense transistor 342. Sense transistor 342 is connected in series between precharge switch 340 and the ground level, where signal EN2b controls precharge switch 340. The input of inverter 344 is connected to the drain of sense transistor 342 and its output is used to generate signal MML_OUT. The circuit combination of switch 340, sense transistor 342 and inverter 344 acts as a sense amplifier to sense and amplify the state of the multiple matchline MML.

The multiple matchline sense circuit operation of FIG. 9 will now be described. Switch 336 is closed, or turned on during a precharge phase, such that the multiple matchline MML is precharged to a low potential level such as ground to turn off sense transistor 342. Switch 334 is open to restrict the application of current to the multiple matchline MML. Also during the precharge phase, switch 340 is closed and the input to inverter 344 is charged to the VDD level, or the high logic level. MML_OUT is therefore at the low logic level. During the course of a search and compare operation, in the sensing phase, switches 336 and 340 are opened, or turned off, and switch 334 is closed to turn on the current source 332, to apply current to the multiple matchline MML.

Application of current to the multiple matchline MML by the current source 332 will eventually raise its voltage level over time. When the voltage level of MML reaches the threshold voltage (minimum voltage required to turn on a transistor) for the n-channel sense transistor 342 of about 0.7V, transistor 342 will turn on to connect the input of inverter 344 to ground. MML_OUT subsequently becomes a high logic level. To reset the circuit to the precharge phase, control signal EN1 will become inactive to turn off switch 334 and to turn on switch 336. The method by which EN1 becomes inactive will be discussed in more detail later. In summary, the multiple matchline detection circuit 330 of FIG. 8 will determine the potential level of the multiple matchline MML relative to the threshold potential level of sense transistor 342. If this voltage level on MML is detected, then signal MML_OUT becomes a high logic level, which can be used by subsequent logic circuits.

Figure 10:
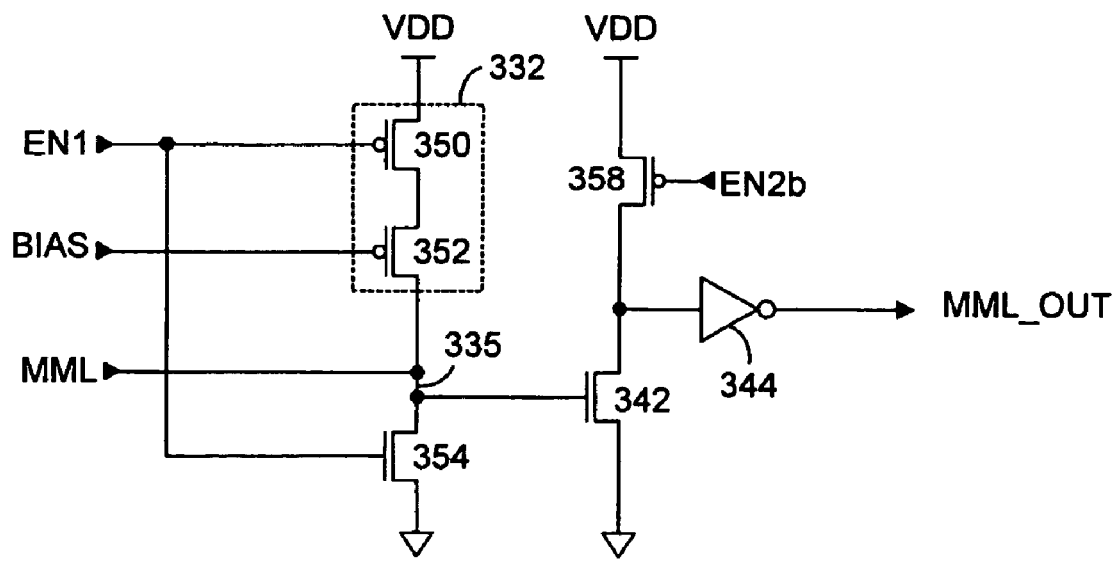
FIG. 10 shows a schematic of a multiple matchline sense circuit in accordance with a third embodiment of the present invention.

The multiple matchline detection circuit of FIG. 10 is a practical CMOS implementation of the generic circuit of FIG. 9. Current source 332 is replaced with p-channel transistors 350 and 352, and switches 336 and 340 are replaced with n-channel transistor 354 and p-channel transistor 358 respectively. Inverter 338 can be removed from the circuit since p-channel transistor 350 and n-channel transistor 354 form a complementary pair. An analog BIAS voltage is applied to the gate of p-channel transistor 352 to control the current supplied to the multiple matchline MML.

In the operation of the multiple matchline detection circuit of FIG. 10, signal EN1 is at a high logic level and EN2b is pulsed to a low logic level during a precharge phase to turn on transistors 354 and 358 respectively, such that the multiple matchline MML is connected to ground to turn off sense transistor 342. To ensure that no current is applied to the multiple matchline MML during the precharge phase, the high logic level EN1 will turn off p-channel transistor 350 of the current source. With the input to inverter 344 charged to the VDD level, or high logic level, MML_OUT is therefore at the low logic level. In the sensing phase, EN1 is at a low logic level to turn on p-channel transistor 350 and to turn off n-channel transistor 354, to allow current source 332 to apply current to the multiple matchline MML. When the voltage level of MML reaches the threshold voltage for the n-channel sense transistor 342 of about 0.7V, transistor 342 will turn on to connect the input of inverter 344 to ground. MML_OUT subsequently becomes a high logic level. The circuit would then be reset in the precharge phase in a manner similar to way the circuit of FIG. 9 is reset.

The current source 332 can also be implemented as a single p-channel transistor with its source connected to VDD, its drain connected to the multiple matchline MML, and its gate connected to EN1, eliminating the requirement for the analog BIAS voltage level. In this case the current will be determined solely by the dimensions of the transistor and the VDD supply level.

The floating input of inverter 344 in the circuit of FIG. 10 during the sensing phase before sense transistor 342 turns on is generally undesirable. If the voltage on the input of inverter 344 falls below its switching point, inverter 344 will incorrectly flip and subsequently output a high MML_OUT logic level even though sense transistor 342 is turned off.

Figure 11:
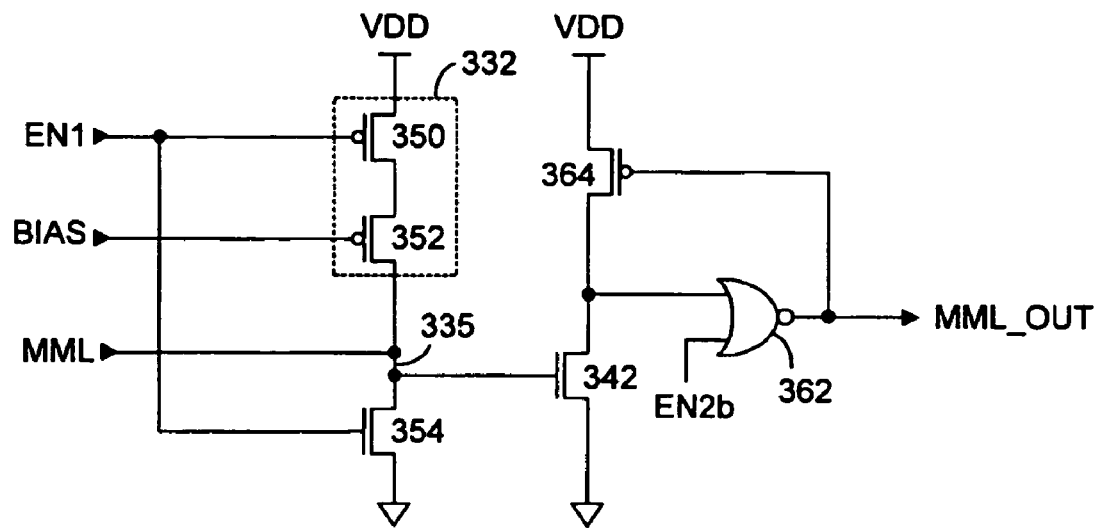
FIG. 11 shows a schematic of a multiple matchline sense circuit in accordance with a fourth embodiment of the present invention.

To address this potential failure a modified multiple matchline sense circuit of FIG. 10 is shown in FIG. 11. The configuration of the circuit of FIG. 11 is the same as the circuit of FIG. 10, with the exception of a 2-input NOR gate 362 which replaces inverter 344. NOR gate 362 has a first input connected to the drain of sense transistor 342 and a second input connected to EN2b. The output MML_OUT from NOR gate 362 is also fed back to the gate of p-channel precharge transistor 364. NOR gate 362 and p-channel precharge transistor 364 form a conventional half-latch to hold the drain of sense transistor 342 at the high potential level. Since both p-channel transistor 364 and sense transistor 342 are turned on if the multiple matchline MML reaches the threshold voltage of transistor 342, Vt, p-channel transistor 364 is designed to be weaker than sense transistor 342. This allows sense transistor 342 to override the 'ON' state of transistor 364. The circuit of FIG. 11 functions equivalently to the circuit of FIG. 10 during the precharge and sense phases. It should be noted that the half-latch circuit of FIG. 11 is not capable of latching a low logic level on the first input of NOR gate 362 during the sensing phase.

Figure 12:
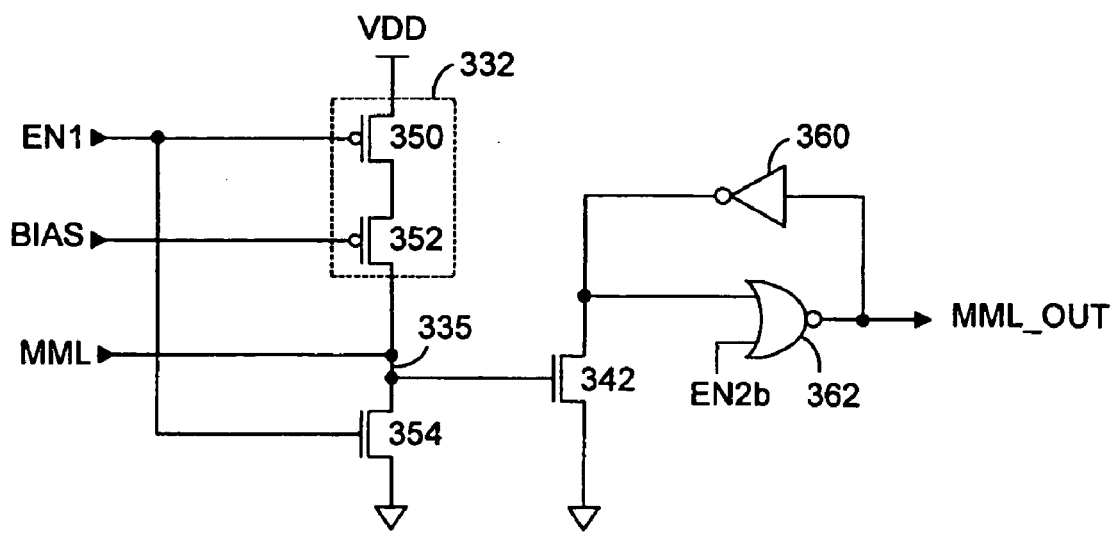
FIG. 12 shows a schematic of a multiple matchline sense circuit in accordance with a fifth embodiment of the present invention.

A modified multiple matchline sense circuit of FIG. 11 is shown in FIG. 12. The configuration of the circuit of FIG. 12 is the same as the circuit of FIG. 11, except a full-latch circuit that replaces the half-latch circuit of FIG. 11. Inverter 360 replaces p-channel transistor 364 from FIG. 11, allowing the full-latch circuit to latch both low and high logic levels on the first input of NOR gate 362. The circuit of FIG. 12 functions equivalently to the circuit of FIG. 11 during the precharge and sense phases.

Figure 13:
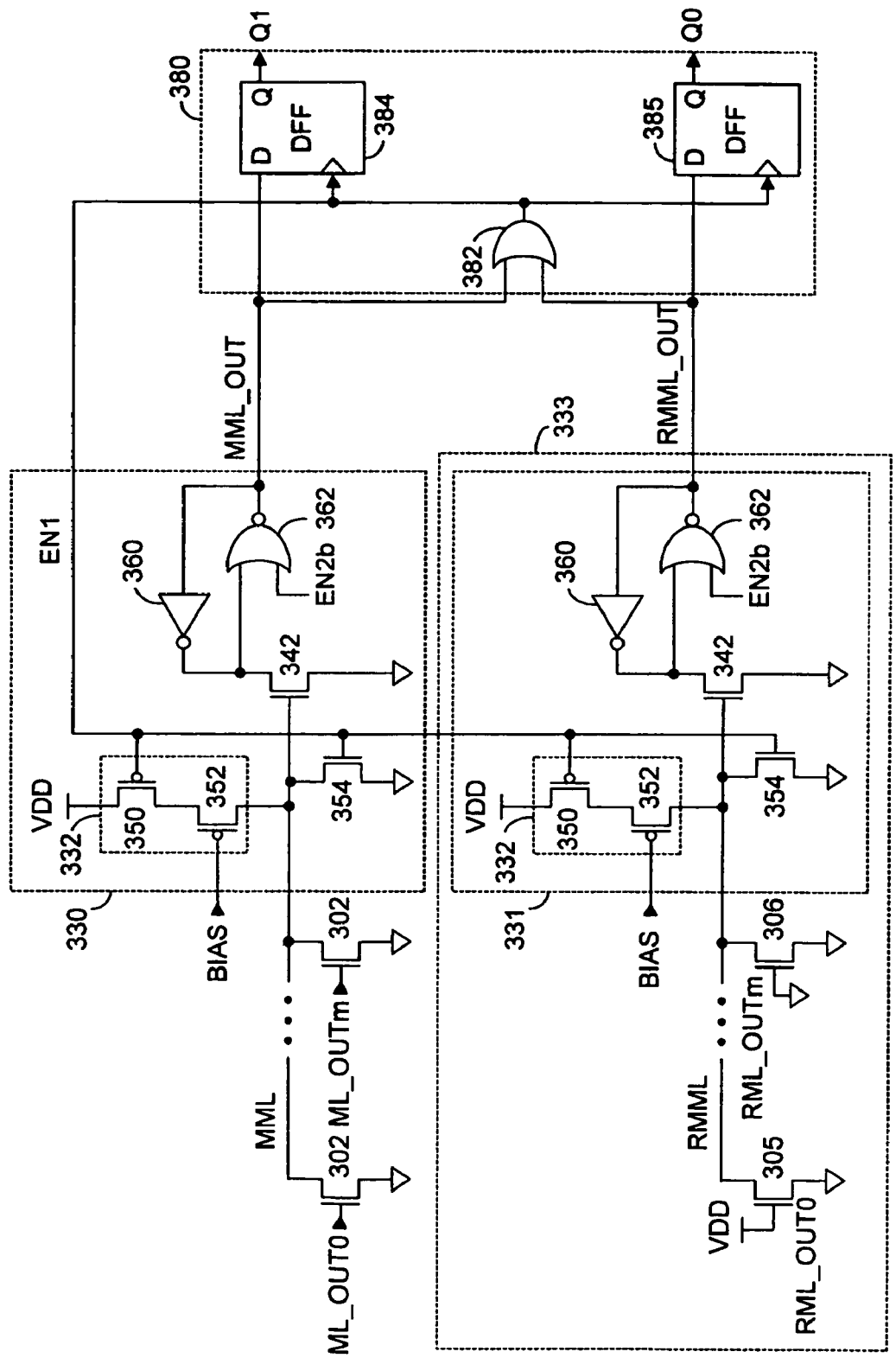
FIG. 13 shows a schematic of a multiple matchline sense circuit in accordance with a sixth embodiment of the present invention.

A multiple matchline detection circuit in accordance with an embodiment of the present invention is shown in FIG. 13. The circuit of FIG. 13 is similar to the multiple matchline circuit of FIG. 8, but includes circuit diagrams for multiple match sense circuit 330, reference for multiple match sense circuit 331 and multiple match decoder 380. The multiple match sense circuits 330 and reference multiple match sense circuit 331 are implemented with multiple match sense circuit of FIG. 12. Multiple match decoder circuit 380 includes OR gate 382 and two D-type flip-flops (DFF) 384 and 385. Signal MML_OUT is connected to the data input of DFF 384 and one input of OR gate 382, while RMML_OUT is connected to the data input of DFF 385 and the other input of OR gate 382. OR gate 382 generates feedback control signal EN1, which is connected to the clock inputs of DFF 384 and DFF 385, DFF 384 and DFF 385 output Q1 and Q0 respectively. Edge triggered D-type flip-flops are well known in the art, and function to pass data appearing on its D input to its Q output when there is a transition from a low level to a high level on its clock input.

Figure 14:
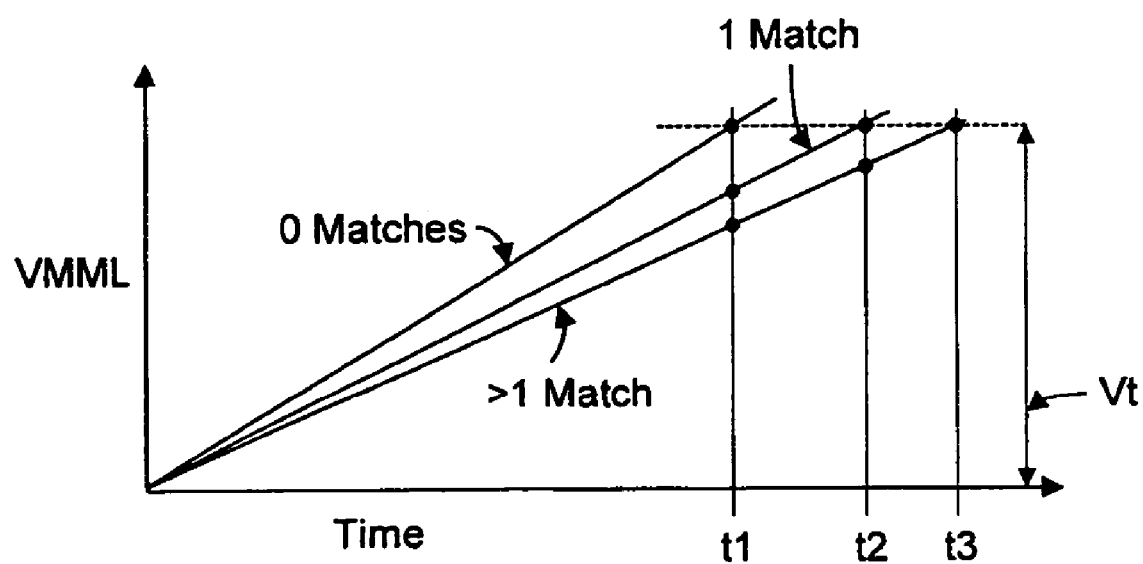
FIG. 14 shows a plot of the multiple matchline voltage versus time for a no match, single match and multiple match conditions.

A description of the multiple matchline sensing operation in accordance with the present invention will now follow with reference to FIGS. 7, 13 and 14. It should be assumed that one or both of MML_OUT and RMML_OUT have been driven to the high logic level from the previous search-and compare operation. The circuit of FIG. 13 will compare the rising voltage rate of the multiple matchline MML to a reference multiple matchline RMML, where the voltage level of MML will rise at a faster, slower or equal rate as the voltage level of RMML. The circuit will then output a two bit result representing one of the three states of MML. After the matchline sense circuits 210 (FIG. 7) have completed their comparison of the search word against their respective stored words, none, one or more ML_OUTi (MLOUT0-ML_OUTn) signals will be driven to the high logic level to indicate the occurrence of a match. Hence, any logic high ML_OUTi will immediately turn on its respective discharge transistor 302 from the multiple match detection circuit of FIG. 13. This will have no effect on MML because the multiple match sense circuit 330 is in the precharge phase in which the current source 332 is turned off and precharge transistor 354 is turned on via signal EN1 at the high logic level to hold MML to low logic level. The multiple match sense circuit 331 connected to RMML is also in the precharge phase due to the high logic level of EN1. Current is then applied to the multiple matchline MML and the reference multiple matchline RMML during the sensing phase when EN1 is set to the low logic level. OR gate 382 generates a low logic level EN1 signal as long as both MML_OUT and RMML_OUT remain at the low logic level. This will occur when EN2b pulses high at the input to NOR gate 362 of multiple match sense circuit 330 and at the input to NOR gate 362 of multiple match sense circuit 331 to start the active phase. The low logic levels of MML_OUT and RMML_OUT are latched via feedback inverters 360, and will remain so until either one of MML and RMML rises to the threshold voltage of its respective sense transistor 342 during the search-and-compare operation. In the case of no matches, no current path is formed between MML and ground, thus allowing the voltage of MML to rise quickly over time. In the case of a single match, where one current path is formed between MML and ground through a single discharge transistor 302, the rate at which the voltage of MML rises over time is slower because a small amount of charge is continually discharged from the multiple matchline MML by the single current path to ground. Therefore the rising rate of the multiple matchline MML voltage over time in the case of a single match is slower than the rising rate in the case where there are no matches. This rising rate becomes even slower due to the existence of multiple parallel current paths between the multiple matchline MML and ground in the case where two or more discharge transistors are turned on, since the current source 332 must overcome multiple pull down paths. The voltage level of RMML will rise at a rate consistent with MML having exactly one discharge transistor 302 turned on. In the present embodiment, only the gate of one discharge transistor 305 is connected to VDD, and the remaining discharge transistors 306 connected to RMML have their gates connected to ground. Therefore the voltage level of RMML will always rise at a rate corresponding to the single match condition.

FIG. 14 shows a plot of MML voltage versus time for the zero match case, the single match case and more than one match case. From the plot of FIG. 14, the time of interest is at t1, when the zero match case MML voltage ramps up to a threshold voltage Vt to turn on sense transistor 342 from the multiple matchline sense circuit 330 of FIG. 13. Although for the single match and the more than one match cases, MML does not reach the Vt level at t1, they will reach Vt some time after t1 at times t2 and t3 respectively, to turn on sense transistor 342. Although a linear relationship between the MML voltage and time is shown, the rising rate of MML with respect to time does not necessarily have to be linear. In other words, using this process according to the invention, the voltage of the multiple matchline will begin to rise when current is provided, but depending on the state of the multiple matchline, (i.e. containing no matches, one match or more than one match) the multiple matchline will rise at one of the three rates shown in FIG. 14. The multiple match circuit of the present embodiment will therefore decide the state of MML based on its delay (negative or positive) in reaching the Vt threshold voltage level relative to the single match state.

In FIG. 13, DFF 384 and 385 will receive, latch and pass the high or low logic levels appearing on their respective D inputs to their Q outputs when clocked by EN1 signal going high. When one or both MML_OUT and RMML_OUT are driven and latched to the high logic level from their precharged low logic levels by multiple match sense circuits 330 and 331, OR gate 382 will immediately generate an active or high logic level EN1 signal. EN1 transitioning to the high logic level will set DFF 384 and 385 into the latch mode, preventing any further changes in the logic levels of either MML_OUT and RMML_OUT from changing the outputs Q1 and Q0. Occurring simultaneously, current sources 332 from multiple match sense circuits 330 and 331 are turned off by the high logic level EN1 to prevent further charging of MML and RMML for conserving power. Thus the multiple matchline detection circuit reenters the precharge phase in preparation for the next search-and-compare operation. In summary, EN1 falls to the low logic level from the precharge high logic level, in response to the high logic level pulse of signal EN2b to start the active phase, and remains at the low logic level for a self timed duration. This self timed duration is approximately the time required by the faster of either MML or RMML to rise between ground and the sense transistor threshold voltage potential, because once sense transistor 342 turns on, NOR gate 362 generates a high logic level signal to begin start the precharge phase. Table 2 below defines the states represented by the different logic level combinations of outputs Q1 and Q0 in relation to MML_OUT and RMML_OUT.

TABLE 2

| MML_OUT | RMML_OUT | Q1 | Q0 | State |
| --- | --- | --- | --- | --- |
| LOW | LOW | LOW | LOW | Reset |
| HIGH | LOW | HIGH | LOW | No matches |
| HIGH | HIGH | HIGH | HIGH | 1 match |
| LOW | HIGH | LOW | HIGH | 2 matches or more |

Figure 15:
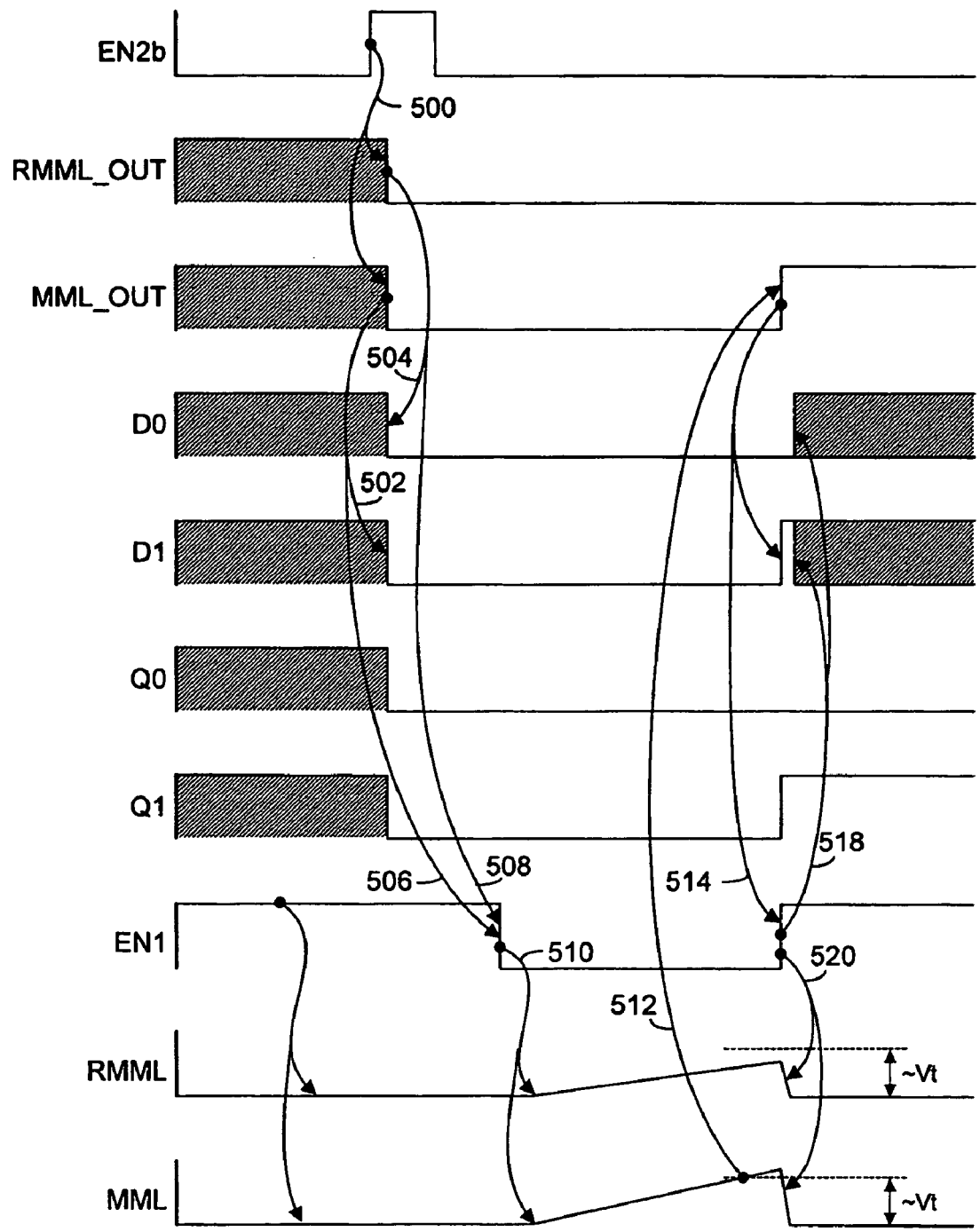
FIG. 15 shows a sequence diagram of the CAM multiple match detection operation according to the present invention.

An example of the multiple matchline detection circuit operation will now be discussed in detail with reference to FIGS. 13 and 15. The sequence diagram shown in FIG. 15 illustrates the logical level transitions in the output of multiple matchlines MML_OUT and RMML_OUT, as they are affected by their respective multiple matchlines MML and RMML and control signals EN2b and EN1. The beginning of an arrow indicates the signal transition that causes an event, and the end of an arrow indicates the effect of the signal transition on another signal. D0 and D1 represent the D inputs for DFF 384 and 385 respectively. Hatched lines represent "don't care" states. In this example, all ML_OUTi signals are at the low logic level, keeping all discharge transistors 302 connected to MML turned off.

It should be assumed that one or both of MML_OUT and RMML_OUT remains at the high logic level from a previous search-and-compare cycle to maintain signal EN1 at the high logic level for keeping MML and RMML at the precharged low level via precharge transistors 354.

First transition arrow 500 indicates the beginning of the EN2b precharge pulse which simultaneously drives and latches MML_OUT and RMML_OUT to the low logic level. Accordingly, D1 and D0 follow the logic levels of MML_OUT and RMML_OUT respectively as indicated by second and third transition arrows 502 and 504. When both MML_OUT and RMML_OUT are at the low logic level, OR gate 382 generates a low logic level EN1 to turn on current sources 332 from multiple match sense circuits 330 and 331, as shown by fourth and fifth transition arrows 506 and 508. EN1 at the low logic level will end the precharge phase and start the sense phase as shown by sixth transition arrow 510. By enabling the current sources 332 of the multiple matchline sense circuit 330 and reference multiple matchline sense circuit 331, the voltage levels of MML and RMML will begin to rise. The voltage level of MML will reach the Vt voltage to turn on sense transistor 342 of multiple matchline sense circuit 330 before the voltage level of RMML reaches the Vt voltage level. At seventh transition arrow 512, MML_OUT is subsequently latched at the high logic level. The high logic level of MML_OUT is reflected in the transition of D1 to the high logic level. At this time, outputs Q0 and Q1 follow the D0 and D1 logic levels. Because RMML has not reached the voltage of Vt, RMML_OUT will remain at the precharged low logic level. The high logic level of MML_OUT will cause OR gate 382 to drive EN1 to the high logic level at the eighth transition arrow 514. Two events occur simultaneously as a result of EN1 being driven to the high logic level. First, at ninth transition arrow 518, DFF 384 and 385 latch their respective D inputs (D1 and D0) from signals MML_OUT and RMML_OUT in response to the transition of EN1 to the high logic level. Since Q0 and Q1 have latched the low and high logic levels respectively, any further changes to the logic levels of MML_OUT and RMML_OUT will have no effect on Q0 and Q1. Note according to Table 2 above, the high logic level Q1 and the low logic level Q0 represents the no match output state of the multiple match detection circuit, which correctly corresponds to this situation in which all ML_OUTi signals are at the low logic level. This is an advantageous feature of the present invention because RMML_OUT changes to the high logic level shortly after MML_OUT when RMML reaches the Vt voltage level, but is prevented from changing Q0 to the high logic level and changing the output state of the multiple match detection circuit. The second event caused by EN1 takes place at transition arrow 520. EN1 will turn off all current sources 332 via transistor 350, and turn on all precharge transistors 354 to quickly pull down multiple matchlines MML and RMML to ground. The multiple matchline sense circuits 330 and 331 are now reset to the precharge phase and ready to perform another sense operation.

In the case of a single match, both RMML and MML would rise to the Vt voltage level at the same time to generate a Q1, Q0 output of HIGH,HIGH. In the case of multiple matches, RMML will rise to the Vt voltage level before MML to generate a Q1, Q0 output of LOW,HIGH. Since the low logic level duration of EN1 is determined by the first multiple matchline (MML or RMML) to reach the Vt voltage level from the precharged ground level, the multiple matchline detection circuit becomes self-timed without the requirement of control signals generated externally from the circuit.

The multiple matchline detection circuit of the present invention has the following advantages. The multiple matchline detection circuit independently distinguishes the no match, single match and multiple match states. The circuit also provides an output corresponding to one of the three states.

Lower power is consumed because multiple matchlines MML and RMML only rise to a Vt and not to a full VDD level before being fully discharged to ground. Since the sensing phase ends after either MML or RMML reaches the Vt level, the sense operation is fast.

There is no requirement for preset timed control signals generated by artificial delays, for activating the matchline sense circuits and multiple matchline detection circuit. The multiple matchline detection circuit can be activated in response to a signal provided by the matchline sense circuits, indicating the end of their sense-and-compare operation. The multiple matchline detection circuit disables itself after a self-timed period. Therefore there is no reliance on externally generated control signals.

Because the reference multiple matchline row is constructed identically and adjacently to the multiple matchline row, any process variations or temperature effects affecting the CAM array will equally affect the reference multiple matchline row. In addition, the sense margin between single, multiple and no match condition is no longer based on some fractional voltage based on transistor ratios and therefore doesn't suffer from temperature or process variations.

Furthermore, the same circuit used for matchline sensing can be and is used for detecting multiple matches, thereby reducing design complexity and optimising performance.

Of course, numerous variations and adaptations may be made to the particular embodiments of the invention described above, without departing from the spirit and scope of the invention, which is defined in the claims.

While the matchline sense circuit of the present invention has been implemented and simulated using CMOS technology on silicon, alternative embodiments can be implemented in other technologies such as BiCMOS.

Although the circuits of FIGS. 9–13 have been implemented to precharge matchlines to ground, the circuits can be inverted in order to precharge multiple matchlines to the VDD voltage supply. Transistors would be replaced with their respective complementary type of transistor and the voltage supply polarities would be swapped with each other. For example, n-channel transistors would be replaced with p-channel transistors, and p-channel transistors would be replaced with n-channel transistors. The inverted multiple matchline sense circuit would precharge multiple matchlines to the VDD supply voltage and detect falling rates of the multiple matchline. A negative current source will discharge the precharged multiple matchline to ground, and any discharge transistor which is turned on will form a current path to the VDD supply voltage. Hence in a no match condition, the falling rate of the multiple matchline will be faster than the falling rate of a reference multiple matchline mimicking a single match condition. In a multiple match condition, the falling rate of the multiple matchline will be slower than the falling rate of a reference multiple matchline mimicking the single match condition.

In addition, p-channel discharge transistors could be contemplated instead of n-channel discharge transistors.

This multiple match detection scheme can be used in both SRAM and DRAM based CAMs. The circuit technique disclosed can also be used in multi-level Flash memory or ROM where each cell can store one of several threshold levels. Typical multi-level Flash cells are programmed by writing two bits of data to raise its threshold to one of three or four voltage levels. The current discharged by a cell will vary according to its programmed threshold voltage when a read voltage is applied. The circuits of the present invention could be useful to sense the two bit data of the cell via the bitline. A dummy cell programmed with the appropriate threshold voltage connected to a dummy bitline will act as the reference to which the current of the bitline is compared against.

Additionally, in associative cache memory applications where a microprocessor searches the cache for an address and data it wants to access, a search and compare operation can be implemented, and the results of the search, i.e. a match or mismatch can be detected using circuits and principles described in this invention.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A sensing circuit for detecting a voltage, comprising:
a sense line;
a current source operatively connected to the sense line, the current source switching between an off state and an on state for changing a sense line voltage from a first voltage level to a second voltage level,
an amplifier for sensing a change in the sense line voltage to the second voltage level and for providing an amplified signal corresponding thereto; and
a detection circuit for providing a multibit output based on a difference in delay between the amplified signal changing from the first voltage level to the second voltage level and a reference signal changing from the first voltage level to the second voltage level.

2. The sensing circuit of claim 1, wherein the sense line is precharged to the first voltage level by a precharge circuit.

3. The sensing circuit of claim 1, further comprising multiple discharge transistors coupled in parallel between the sense line and ground voltage, the gate of each of the multiple discharge transistors being coupled to an output from a respective matchline sense circuit.

4. The sensing circuit of claim 1, wherein the sense line is precharged to the first voltage level when the current source is in the off state.

5. The sensing circuit of claim 1, wherein the first voltage level is a logic low voltage level.

6. The sensing circuit of claim 1, wherein the first voltage level is a logic high voltage level.

7. The sensing circuit of claim 1, wherein the current source includes at least one p-channel transistor connected in series between a supply voltage and the sense line.

8. The sensing circuit of claim 1, wherein the current source includes at least one n-channel transistor connected in series between a supply voltage and the sense line.

9. The sensing circuit of claim 1, wherein the second voltage is an n-channel transistor threshold voltage.

10. The sensing circuit of claim 1, wherein the second voltage is a p-channel transistor threshold voltage.

11. The sensing circuit of claim 1, wherein the reference signal is generated from a reference sensing circuit.

12. The sensing circuit of claim 11, wherein the reference sensing circuit includes:
a dummy sense line;
a dummy current source operatively connected to the dummy sense line, the dummy current source switching between the on state and the off state for changing a dummy sense line voltage from the first voltage level to the second voltage level, and
a dummy amplifier for detecting the second voltage level and for providing the reference signal.

13. The sensing circuit of claim 1, wherein the detection circuit includes:
a logic gate for receiving the amplified signal and the reference signal for providing a control signal;
a first flip flop circuit for receiving the amplified signal and the control signal, for providing a first data signal; and
a second flip flop circuit for receiving the reference signal and the control signal, for providing a second data signal.

14. The sensing circuit of claim 1, wherein the output is maintained by a latching circuit.

15. The sensing circuit of claim 13, wherein the first and second flip flop circuits latch the first and second data signals in response to a transition in the voltage level of the control signal.

16. The sensing circuit of claim 13, wherein a no match condition is determined when the first data signal is at a high logic level and the second data signal is at a low logic level.

17. The sensing circuit of claim 13, wherein a single match condition is determined when the first data signal is at the high logic level and the second data signal is at the high logic level.

18. The sensing circuit of claim 13, wherein a multiple match condition is determined when the first data signal is at a low logic level and the second data signal is at a high logic level.

19. A method for detecting a voltage level, comprising the steps of:
providing current to a sense line and a dummy sense line for changing a sense line and dummy sense line voltage level from a first voltage level to a second voltage level;
detecting the transition of the sense line and dummy sense line from the first voltage level to the second voltage level;
inhibiting current from the sense line and the dummy sense line when either the sense line or the dummy sense line reaches the second voltage level; and
providing a multibit output based on a difference in delay between the sense line changing from the first voltage level to the second voltage level and a reference signal changing from the first voltage level to the second voltage level.

20. A content addressable memory comprising:
an array of content addressable memory cells arranged in rows and columns;
an address decoder;
data access circuitry; and
a sensing circuit having a multiple match line; a current source operatively connected to the multiple match line, the current source switching between an off state and an on state for changing the multiple match line from a first voltage level to a second voltage level; an amplifier for detecting the second voltage level for providing an amplified signal corresponding thereto; and a detection circuit for providing an output corresponding to a delay between the sense line changing from the first voltage level to the second voltage level and a reference signal changing from the first voltage level to the second voltage level.

* * * * *

UNITED STATES PATENT AND TRADEMARK OFFICE
CERTIFICATE OF CORRECTION

PATENT NO. : 7,095,640 B2 Page 1 of 1
APPLICATION NO. : 11/285197
DATED : August 22, 2006
INVENTOR(S) : Stanley Je-Chun Ma and Peter P. Ma It is certified that error appears in the above-identified patent and that said Letters Patent is hereby corrected as shown below:

Please insert the following on the Title page of the patent directly below the Related U.S. Application Data:

--(30)          Foreign Application Priority Data
     May 31, 2000          (CA) ................................ 2310295--

Please replace the CROSS-REFERENCE TO RELATED APPLICATIONS section at column 1, line 3-12 with the following:

CROSS-REFERENCE TO RELATED APPLICATIONS
This application is a Continuation of U.S. patent application Ser. No. 10/296,884, filed on May 31, 2001 now U.S. Pat. No. 6,990,001, which is a National Phase of PCT Patent Application Ser. No. CA01/00797 filed on May 31, 2001, which claims the benefit of priority of Canadian Patent Application No. 2,310,295 filed on May 31, 2000.

Signed and Sealed this

Eighth Day of December, 2009

David J. Kappos
*Director of the United States Patent and Trademark Office*